(12) United States Patent
Petladwala et al.

(10) Patent No.: US 12,044,714 B2
(45) Date of Patent: Jul. 23, 2024

(54) ANOMALY DETECTION APPARATUS, METHOD AND COMPUTER-READABLE MEDIUM

(71) Applicant: NEC Corporation, Tokyo (JP)

(72) Inventors: Murtuza Petladwala, Tokyo (JP); Mitsuru Sendoda, Tokyo (JP); Yuko Ohta, Tokyo (JP); Ryota Suzuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 729 days.

(21) Appl. No.: 17/270,899

(22) PCT Filed: Aug. 30, 2018

(86) PCT No.: PCT/JP2018/032129
§ 371 (c)(1),
(2) Date: Feb. 24, 2021

(87) PCT Pub. No.: WO2020/044495
PCT Pub. Date: Mar. 5, 2020

(65) Prior Publication Data
US 2021/0247427 A1 Aug. 12, 2021

(51) Int. Cl.
*G01R 23/10* (2006.01)
*G01R 23/14* (2006.01)
*G01R 23/18* (2006.01)

(52) U.S. Cl.
CPC ........... *G01R 23/10* (2013.01); *G01R 23/145* (2013.01); *G01R 23/18* (2013.01)

(58) Field of Classification Search
CPC ...... G01R 21/06; G01R 23/10; G01R 23/145; G01R 23/18; G05B 23/024; G06N 20/00
See application file for complete search history.

(56) References Cited

U.S. PATENT DOCUMENTS

2006/0212238 A1* 9/2006 Nisenblat ............... G01R 21/06
702/66
2012/0001574 A1 1/2012 Akaishi et al.
(Continued)

FOREIGN PATENT DOCUMENTS

JP 2001-318031 A 11/2001
JP 2011-059790 A 3/2011
(Continued)

OTHER PUBLICATIONS

H. Qiu, Y. Tu and Y. Zhang, "Anomaly detection for power consumption patterns in electricity early warning system", International Conference on Advanced Computational Intelligence, 2018. (Year: 2018).*

(Continued)

*Primary Examiner* — Yoshihisa Ishizuka

(57) ABSTRACT

Provided a method comprising: obtaining waveform data sets of a periodic electric waveform signal, with a length set to one cycle time; calculating a frequency spectrum for each waveform data set; extracting and separating odd and even frequency harmonics to create odd and even frequency harmonic matrices on which a canonical correlation analysis (CCA) being applied to obtain CCA features; performing linear transformation on the CCA features to obtain linear transformed features; generating a model based on the linear transformed features; performing magnitude quantization of frequency spectrums of waveform data sets to identify normal and anomalous waveform signals.

18 Claims, 10 Drawing Sheets

(56) References Cited

U.S. PATENT DOCUMENTS

2012/0166142 A1  6/2012  Maeda et al.
2015/0253364 A1  9/2015  Hieda et al.
2015/0269293 A1  9/2015  Hatano et al.

FOREIGN PATENT DOCUMENTS

| JP | 2012-016102 A | 1/2012 |
| JP | 2012-098133 A | 5/2012 |
| JP | 2014-072561 A | 4/2014 |
| JP | 2015-179443 A | 10/2015 |

OTHER PUBLICATIONS

D.R. Hardoon, S. Szedmak and J. Shawe-Taylor, "Canonical Correlation Analysis: an overview with application to learning methods", Neural Computation, vol. 16, No. 12, pp. 2639-2664, 2004. (Year: 2004).*

International Search Report for PCT Application No. PCT/JP2018/032129, mailed on Nov. 27, 2018.

English translation of Written opinion for PCT Application No. PCT/JP2018/032129, mailed on Nov. 27, 2018.

Akaho, "Introduction to Canonical Correlation Analysis -Mutual Information Extraction from Multimodal Observations—", Japanese Neural Network Society Journal, vol. 20, No. 2, Jun. 5, 2013, pp. 62-72.

Japanese Office Communication for JP Application No. 2021-511011 mailed on Feb. 8, 2022 with English Translation.

* cited by examiner

FIG. 6

|  |  | Predicted Labels | |
|---|---|---|---|
|  |  | 0 | 1 |
| Quantized Labels | 0 (Normal) | 10 | 90 |
|  | 1 (Anomaly) | 80 | 20 |

Matrix D

# ANOMALY DETECTION APPARATUS, METHOD AND COMPUTER-READABLE MEDIUM

This application is a National Stage Entry of PCT/JP2018/032129 filed on Aug. 30, 2018, the contents of all of which are incorporated herein by reference, in their entirety.

FIELD

The present invention relates to an anomaly detection apparatus, method, and computer-readable medium.

BACKGROUND

In a supervised learning, labelled data set, i.e., values of inputs and values of expected outputs, are prepared to create a learned model with respect to relationship between inputs and outputs. Given a new input, an output can be predicted using the learned model. In an unsupervised learning, inputs are provided but not outputs, and input data set is clustered into groups or clusters. Using a cluster model, it is possible to predict an output given a new input.

In a clustering approach, feature values are preferably clustered into respective clusters by searching the number of clusters best fit to the input data. For example, using domain knowledge or prior information of measured data, trial to find the best number of clusters is performed.

Regarding waveform data of an electric signal such as a consumption current of an electric appliance measured by a measurement device to learn normal and anomalous operations of the electric appliance, separation between two sets of clusters (i.e., normal and anomaly clusters) is preferably good enough that the two sets of cluster centers are far apart from each other. Feature extraction is performed either based on domain knowledge or dimension reduction techniques. Principal Component Analysis (PCA), i.e., a linear transformation method is utilized as a common feature extraction method. Autoencoder method, i.e., a non-linear transformation method, is also utilized for feature extraction. Autoencoder is a neural network where input to the network is the same as the output by placing constraints on the network such as the number of hidden units in the network being smaller than that of the input. An autoencoder learns a compact coding representation of the input, with no need for labels.

Regarding anomaly detection based on signal processing, PTL (Patent Literature) 1 discloses an abnormality diagnosing method for a device having a movable component, capable of grasping easily whether a condition of the device is normal or not (abnormal). A raw waveform as to vibration of the device is normalized to find a normalized waveform. A data of the normalized waveform is Fast-Fourier-transformed (FFT) to find a data of a frequency component, i.e., a power spectrum. A data as to vibration of the device under a normal condition is preliminarily found by the same manner. Abnormality diagnosis for the device is conducted based on a remaining power spectrum provided by subtracting a power spectrum in the normal condition from the power spectrum in the diagnosis.

[PTL 1] JP Patent Kokai Publication No. JP2001-318031A

SUMMARY

In unsupervised learning approach, there may be a case where feature transformation fails to create discriminative features from normal and anomaly electric current waveforms. A decision boundary in unsupervised approach is unknown or not well-separated, as compared to supervised classification and semi-supervised one-class methods. Since in an unsupervised clustering scheme based on feature transformation, labels or information to estimate a decision boundary is not available or not known, the unsupervised clustering scheme may fail to create well separated clusters of normal and anomalous waveform signals.

Accordingly, it is an object of the present invention to provide an apparatus, a method, a program recording medium, each enabling to create well separated clusters of normal and anomalous waveform signals.

According to an aspect of the present invention, there is provided an anomaly detection apparatus comprising:

an input unit configured to obtain a plurality of sets of waveform data of a periodic electric waveform signal of an electric appliance, with a length of each individual waveform data being set to one cycle time of the periodic electric waveform;

a frequency spectrum processing unit configured to calculate a frequency spectrum for each of the plurality of individual waveform data sets;

a separation unit configured to extract and separate odd and even frequency harmonics of a fundamental frequency which is a reciprocal of the one cycle time from each of the frequency spectrums of the individual waveform data sets to create odd and even frequency harmonic matrices;

a canonical correlation analysis (CCA) unit configured to perform a canonical correlation analysis on the odd and even frequency harmonic matrices to obtain CCA features;

a linear transformation unit configured to perform linear transformation on the CCA features to obtain linear transformed features;

a model generation unit configured to generate a model based on the linear transformed features;

an identification unit configured to perform magnitude quantization of a plurality of the frequency spectrums of the plurality of sets of waveform data to identify normal and anomalous waveform signals; and an output unit configured to output at least the identified result.

According to an aspect of the present invention, there is provided an anomaly detection method comprising:

obtaining a plurality of sets of waveform data of a periodic electric waveform signal of an electric appliance, with a length of each of individual waveform data sets being set to one cycle time of the periodic electric waveform;

calculating a frequency spectrum for each of the plurality of individual waveform data sets;

extracting and separating odd and even frequency harmonics of a fundamental frequency which is a reciprocal of the one cycle time from each of the frequency spectrums of the individual waveform data sets to create odd and even frequency harmonic matrices;

performing a canonical correlation analysis (CCA) on the odd and even frequency harmonic matrices to obtain CCA features;

performing linear transformation on the CCA features to obtain linear transformed features;

generating a model based on the linear transformed features;

performing magnitude quantization of a plurality of the frequency spectrums of the plurality of sets of waveform data to identify normal and anomalous waveform signals; and outputting at least the identified result.

According to an aspect of the present invention, there is provided a computer-readable recording medium storing therein a program causing a computer to execute processing comprising:

obtaining a plurality of sets of waveform data of a periodic electric waveform signal of an electric appliance, with a length of each of individual waveform data sets being set to one cycle time of the periodic electric waveform;

calculating a frequency spectrum for each of the plurality of individual waveform data sets;

extracting and separating odd and even frequency harmonics of a fundamental frequency which is a reciprocal of the one cycle time from each of the frequency spectrums of the individual waveform data sets to create odd and even frequency harmonic matrices;

performing a canonical correlation analysis (CCA) on the odd and even frequency harmonic matrices to obtain CCA features;

performing linear transformation on the CCA features to obtain linear transformed features;

generating a model based on the linear transformed features;

performing magnitude quantization of a plurality of the frequency spectrums of the plurality of sets of waveform data to identify normal and anomalous waveform signals; and outputting at least the identified result.

The recording medium may be a non-transitory computer-readable recording medium such as a semiconductor memory (Random Access Memory (RAM), Read Only Memory (ROM), Electrically Erasable and Programmable Read Only Memory (EEPROM), flash memory, or the like), Hard Disk Drive (HDD), Solid State Drive (SSD), Compact Disc, Digital Versatile Disc, and so forth).

According to the present invention, it is made possible to create well separated clusters of normal and anomalous waveform signals. Other advantages and features of the invention would be apparent from the following description, drawings and claims.

BRIEF DESCRIPTION OF DRAWINGS

FIG. 6 is a diagram for explaining the first example embodiment.

DETAILED DESCRIPTION

Figure 1:
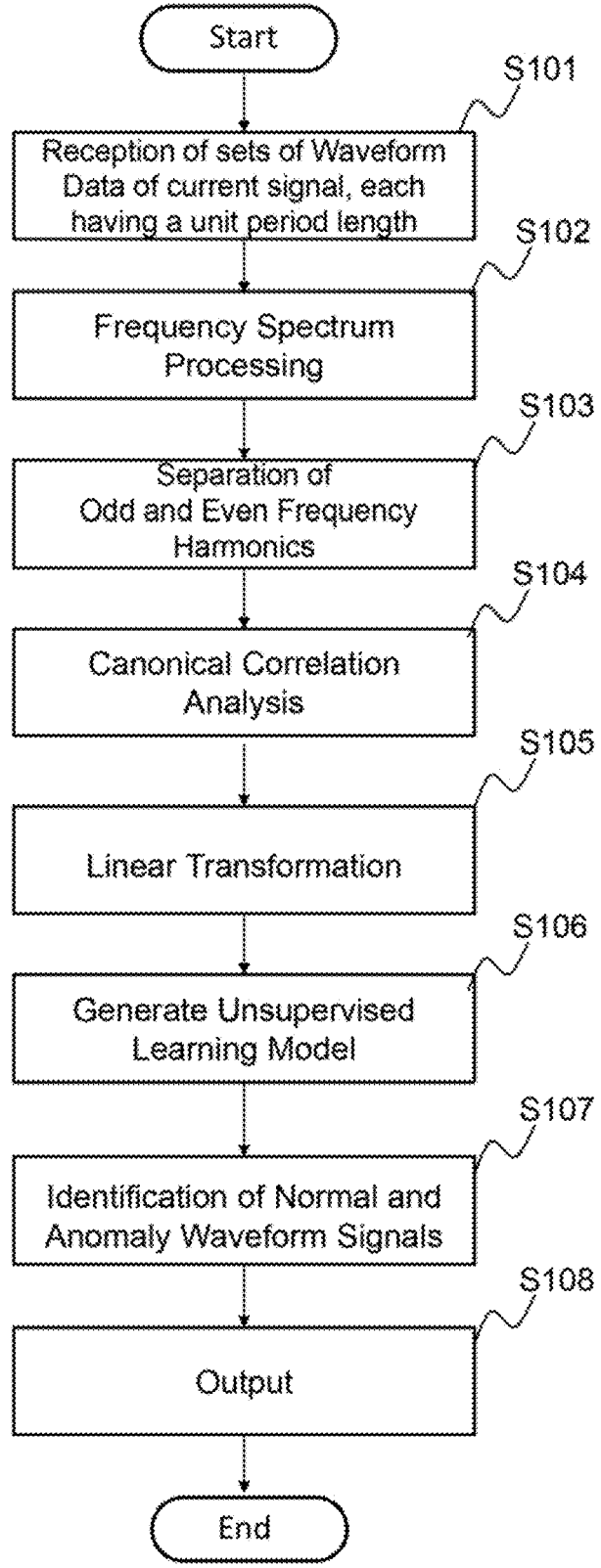
FIG. 1 is a flow chart illustrating an operation of a first example embodiment.

The following describes example embodiments of the present invention. FIG. 1 is a flowchart illustrating an anomaly detection method of the present example embodiment. The method may be preferably performed by a processor coupled to a memory to store computer program instructions executable by the processor and data for processing by the processor, wherein the program instructions stored in the memory executed by the processor configures an anomaly detection apparatus which will be later described with reference to the drawings.

<Step S101> The anomaly detection apparatus gets a plurality of sets of waveform data of an Alternating-Current (AC) current signal (such as consumption current signal) of an electric appliance. Each of individual waveform data sets has a length set to one cycle time of the AC current signal (AC power supply). The anomaly detection apparatus may be configured to receive a plurality of sets of waveform data of an AC current signal from a measurement device. Alternatively, the anomaly detection apparatus may be so configured to receive waveform data of a plurality of cycles of an AC current signal and slice the waveform data into the plurality of sets of waveform data, with each waveform data set having a length set to one cycle time of the AC current signal.

<Step S102> The anomaly detection apparatus calculates and processes a frequency spectrum for each of individual waveform data sets. The anomaly detection apparatus may store sets of frequency spectrums of individual waveform data sets in a form of a matrix (frequency spectrum matrix) with the number of rows=the number of individual waveform data sets and the number columns=the number of frequency components (bins) of the frequency spectrum.

<Step S103> The anomaly detection apparatus separates odd and even frequency harmonics of a fundamental frequency which is a reciprocal of a period (one cycle time) of the AC current signal (the fundamental frequency is equal to the AC power supply frequency), from each of the plurality of frequency spectrums in the frequency spectrum matrix to create odd and even frequency harmonic matrices. The number of rows of the odd and even frequency harmonic matrices is the number of waveform data sets, and the number of columns of the odd and even frequency harmonic matrices are respectively set to the number of odd frequency harmonics and the number of even frequency harmonics in the frequency spectrum of each waveform data set.

<Step S104> The anomaly detection apparatus performs a canonical correlation analysis (CCA) on features (FFT features) of the odd and even frequency harmonic matrices. CCA transforms the odd and even matrices to a feature space in which, each transformed feature dimension is highly correlated with corresponding dimensions between the two matrices.

<Step S105> The anomaly detection apparatus performs linear transformation on CCA features to obtain linear transformed features.

<Step S106> The anomaly detection apparatus generates an unsupervised learning model, such as cluster model, based on the linear transformed features.

<Step S107> The anomaly detection apparatus performs iteratively magnitude quantization (wherein a magnitude calculated is encoded as 2-bins histogram) over frequency harmonics in sets of frequency spectrums of individual waveform data sets (frequency spectrum matrix) to identify normal and anomaly (anomalous) waveform signals.

<Step 108> The anomaly detection apparatus outputs at least the identified result.

According to the example embodiment, it is possible to create well separated clusters of normal and anomalous waveform signals.

Further, in the related technology, it is difficult to automatically identify which cluster is normal and which is anomaly. According to the example embodiment, by applying an unsupervised approach in a signal analysis, it is made possible to identify clusters as normal or anomaly automatically.

Figure 2:
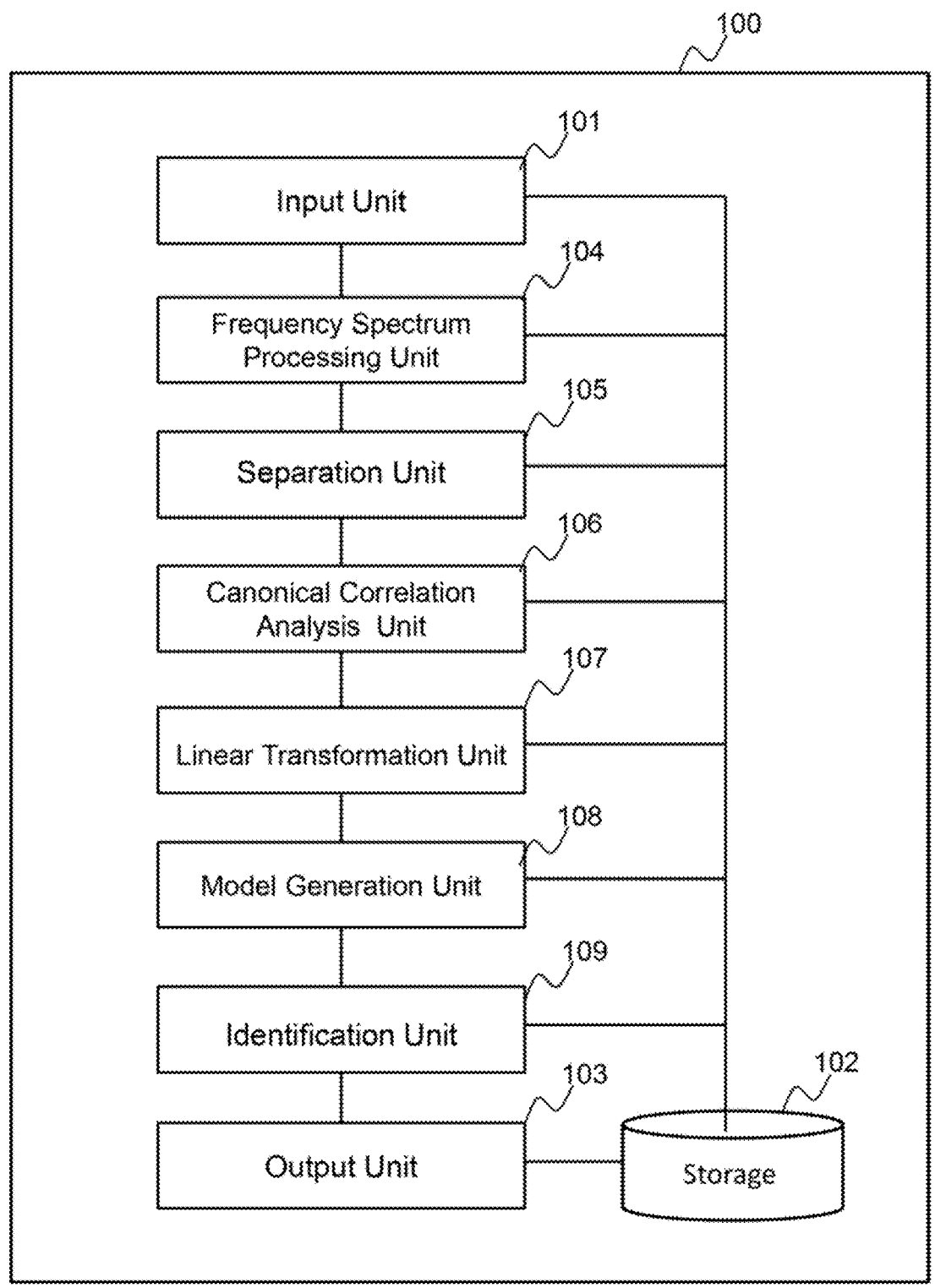
FIG. 2 is a diagram illustrating an arrangement of a first example embodiment.

FIG. 2 is a diagram illustrating an arrangement of an anomaly detection apparatus 100 according to a first example embodiment. Referring to FIG. 2, the anomaly detection apparatus 100 includes an input unit 101, a storage unit 102, an output unit 103, a frequency spectrum processing unit 104, a separation unit 105, a canonical correlation analysis (CCA) unit 106, a linear transformation unit 107, a model generation unit 108 and an identification unit 109.

The input unit 101 receives, from a measurement device (not shown), a plurality of sets of waveform data (sampled digital data) of an AC current signal of an electric appliance, wherein a length of each of individual waveform data sets is set to a period (one cycle time) of the AC current signal (i.e., one cycle time of an AC power supply cycle). As the measurement device, a smart tap, a current sensor such as CT (Current Transformer) or the like may be utilized, though not limited thereto. The measurement device (not shown) may supply to the input unit 101 a plurality of sets of waveform data, each of the individual waveform data sets having a phase aligned to a start of a cycle (zero-cross) of an AC voltage signal. The input unit 101 may include a network interface card to communicate via a network with the measurement device (not shown). The anomaly detection apparatus 100 may be configured to instruct the measurement device (not shown) to transmit a plurality of sets of waveform data of an AC current signal to the anomaly detection apparatus 100. The input unit 101 stores the plurality of sets of waveform data in the storage unit 102.

The measurement device (not shown) may be so configured to slice or segment the waveform data of the AC current signal into a plurality of sets of waveform data, wherein each of individual waveform data sets has a length set to a period (one cycle time) of the AC current signal (i.e., AC power supply cycle) and has a phase aligned to a start of a cycle (zero-cross) of an AC voltage signal fed to the electric appliance, and transmit the plurality of sets of waveform data to the input unit 101. Alternatively, the input unit 101 may acquire waveform data of a plurality of cycles of an AC current signal flowing through the electric appliance and corresponding waveform data of a plurality of cycles of an AC voltage signal fed to the electric appliance, wherein sampling (time and frequency) of the AC voltage signal is configured to be the same as (synchronized with) that of the AC current signal. The input unit 101 may slice the waveform data of a plurality of cycles of the AC current signal into a plurality of sets of waveform data, wherein each of individual waveform data sets has a length set to a period (one cycle time) of the AC current signal (i.e., one cycle time of the AC voltage signal) and has a phase aligned to a start of a cycle (zero-cross) of the AC voltage signal.

The frequency spectrum processing unit 104 reads the plurality of sets of waveform data from the storage unit 102. The frequency spectrum processing unit 104 then calculates a frequency spectrum of each of the individual waveform data sets (also termed as a frame), using FFT (Fast Fourier Transform) to perform processing such as normalization and filtering of the frequency spectrum of each of the individual waveform data sets, individually, i.e., on a per frame basis. The frequency spectrum processing unit 104 stores the frequency processing results of the plurality of frames in the storage 102, in a form of a frequency spectrum matrix with the number of rows=the number of individual waveform data sets and the number columns=the number of frequency components in the frequency spectrum.

The separation unit 105 separates odd and even frequency harmonics of a fundamental frequency of the AC current signal (=AC power supply frequency=50 Hz or 60 Hz) from each of the plurality of frequency spectrums of the plurality of individual waveform data sets (frames) to create odd and even frequency harmonic matrices with the number of rows=the number of individual waveform data sets (frames) and the number columns=the number of odd and even frequency harmonics in the frequency spectrum. Since each of the individual waveform data sets with a length set to a period (one cycle time) of the AC current signal is obtained by slicing a periodic AC current signal on a per cycle basis, and FFT is performed on each of the individual waveform data sets, frequency components in the frequency spectrum of each of the individual waveform data sets are frequency harmonics of the fundamental frequency (reciprocal of the period), and the separation of odd and even frequency harmonics can be performed without loss of relevant information. In a case where the measurement device (not sown) measures the AC current signal of an electric appliance with a rotating machine, such as a motor or the like, frequency harmonics possess peaks in the frequency spectrum. When the electric appliance is in an anomaly state, extra peaks in frequency components may be observed in the frequency spectrum of the individual waveform data.

The canonical correlation analysis unit 106 performs a canonical correlation analysis between two data sets, i.e., the odd and even frequency harmonic matrices to find projective directions which maximize correlation between latent feature vectors of the odd and even frequency harmonic matrices.

The linear transformation unit 107 performs linear transformation on features (termed as CCA transformed features) subjected to the canonical correlation analysis to obtain transformed features, dimension of which has been reduced.

The model generation unit 108 generates a model based on the transformed features subjected to dimension-reduction by the linear transformation unit 107. The CCA transformed features can also be modeled by only odd frequency harmonics, only even frequency harmonics, and by combination of odd frequency harmonics and even frequency harmonics.

The identification unit 109 performs iteratively magnitude quantization (wherein the magnitude is encoded as 2-bins histogram) over frequency harmonics in the frequency spectrum matrix to identify normal and anomaly waveform signals.

The output unit 103 may output at least the identified result or anomaly detection process. The output unit 103 may include a display device, printer, data storage device which stores data into a storage, communication device, or any combination thereof.

Figure 3:
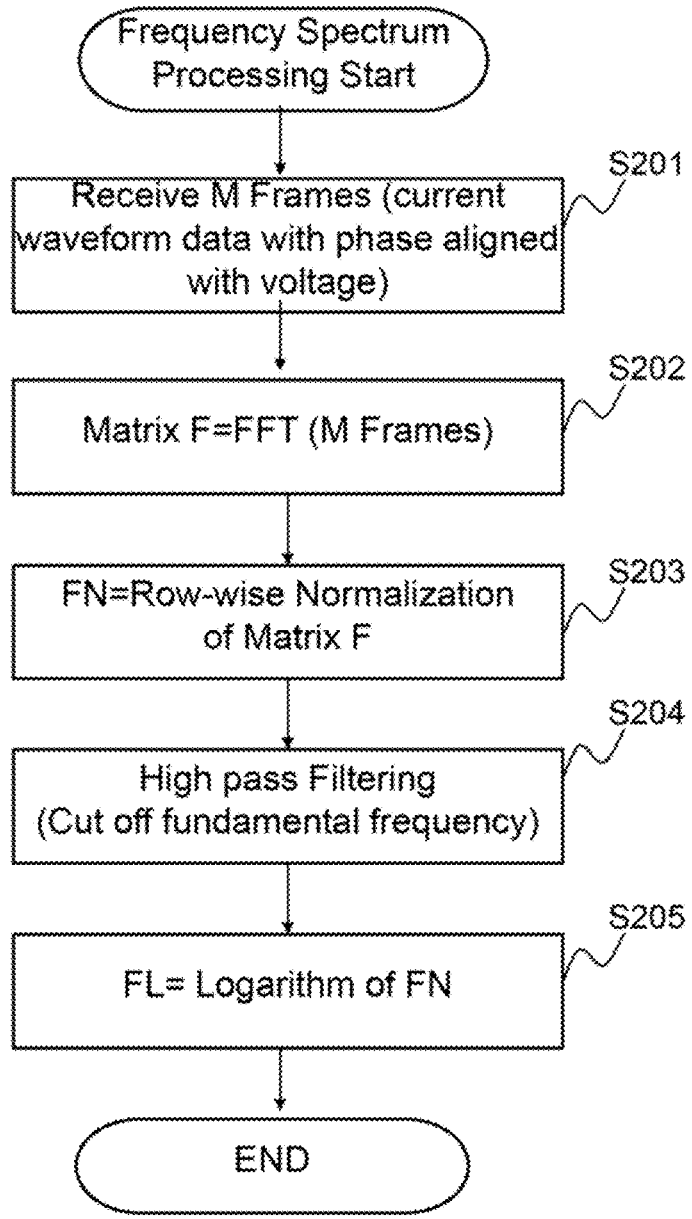
FIG. 3 is a flow chart illustrating an operation of the first example embodiment.

FIG. 3 is a flow chart illustrating an operation of the frequency spectrum processing unit 104. Let's assume that the input unit 101 receives M (predetermined integer) sets of waveform data of an AC current signal of an electric appliance (Step S201).

The frequency spectrum processing unit 104 calculates M sets of frequency spectrums (spectra) from the M sets of waveform data (time domain data), by applying FFT (Fast Fourie Transform) respectively to the M sets of waveform data (Step S202). In the following, DFT (Discrete Fourier Transform) is used only for the sake of simplicity and ease of explanation.

Assuming that the individual waveform data (one frame) consist of x=[x(0), x(T), x(2*T), . . . , x((N−1)*T)], where T is a sampling interval. When x(n*T) is denoted by x(n), DFT (Discrete Fourier Transform) of the waveform data is given as follows:

$$X(k) = \sum_{n=0}^{N-1} x(n) e^{-\frac{j2\pi kn}{N}}, k = 0, 1, \ldots, N-1 \qquad (1)$$

where X(k) is a complex DFT coefficient at a k-th frequency bin (frequency: k/(T*N)).

$$X(k) = R(k) + jI(k), k=0,1, \ldots, N-1 \qquad (2)$$

where R(k) and I(k) represent respectively a real part and an imaginary part of the DFT coefficient X(k), and $j^2 = -1$ An amplitude (magnitude) and a phase at the k-th frequency bin is given as follows:

$$\|X(k)\| = \sqrt{R(k)^2 + I(k)^2} \qquad (3)$$

$$\varphi(k) = \tan^{-1}\left(\frac{I(k)}{R(k)}\right) \qquad (4)$$

When the M sets of waveform data are denoted in the order of time, as $X_1$, $X_2$, and $X_M$, the i-th frequency spectrum corresponding to the i-th waveform data (i-th frame) is represented as $$X_i = [\|X_i(0)\| \ldots, \|X_i(N-1)\|], i=1, \ldots, M \qquad (5)$$

M by N matrix (denoted as M*N matrix, or matrix of (M, N)) F (also termed as frequency spectrum matrix) is given as follows.

$$F = \begin{pmatrix} X_1 \\ \vdots \\ X_M \end{pmatrix} = \begin{pmatrix} X_1(0) & \cdots & X_1(N-1) \\ \vdots & \ddots & \vdots \\ X_M(0) & \cdots & X_M(N-1) \end{pmatrix} \qquad (6)$$

Each row of the frequency spectrum matrix F is preferably individually normalized (Step S203). As an example of the normalization of the frequency spectrum, each element of a row the frequency spectrum matrix F is divided by a normalization factor $NF_i$ (i=1, . . . , M) to generate a matrix FN.

$$FN = \begin{pmatrix} \left(\frac{1}{NF_1}\right)X_1 \\ \vdots \\ \left(\frac{1}{NF_M}\right)X_M \end{pmatrix} = \begin{pmatrix} \frac{1}{NF_1}X_1(0) & \cdots & \frac{1}{NF_1}X_1(N-1) \\ \vdots & \ddots & \vdots \\ \frac{1}{NF_M}X_M(0) & \cdots & \frac{1}{NF_M}X_M(N-1) \end{pmatrix} \qquad (7)$$

where, though not limited thereto, the i-th normalization factor $NF_i$ (i=1, . . . , M) is defined as a sum of amplitudes of elements in the i-th row of the frequency spectrum matrix F, for example:

$$NF_i = \sum_{k=0}^{N-1} \|X_i(k)\| \qquad (8)$$

The normalization on a per row basis, which sets values of elements in each row of the frequency spectrum matrix F in the range between 0 and 1, is preferably executed in order to change time-domain characteristics or properties of the waveform data in each column of the matrix FN.

The frequency spectrum processing unit 104 applies high-pass filtering to each row of the matrix FN (Step S204). The high-pass filtering is used to cut off a DC component and frequency components not more than a fundamental frequency (AC power supply frequency $f_0$: 50/60 Hz) or less than 2nd harmonics thereof to extract harmonics (2nd, 3rd . . . ) of the fundamental frequency. The high-pass filtering may be performed, in a frequency domain, by multiplying a frequency spectrum of a high pass filter and each row (normalized frequency spectrum) of the matrix FN.

The frequency spectrum processing unit 104 may further perform logarithmic conversion (such as logarithm of base 10) of each row of the matrix FN subjected to the high pass filtering (Step S205) to create the matrix FL. Each element of the matrix FL corresponds to a decibel representation of the amplitude (magnitude) spectrum.

$$FL = \begin{pmatrix} \log\left(\left(\frac{1}{NF_1}\right)X_1'\right) \\ \vdots \\ \log\left(\left(\frac{1}{NF_M}\right)X_M'\right) \end{pmatrix} \qquad (9)$$

where $(1/NF_1)X_1'$, . . . , and $(1/NF_M)X_M'$ are high-pass filtered normalized frequency spectrums of the first to M-th frames (waveform data sets).

The time domain waveform data (frame) can be expressed (approximated) as a Fourier expansion, as follows.

$$x(t) = \sum_{k=0}^{N-1} A_k \sin(2\pi f_k t + \varphi_k) \qquad (10)$$

where,
$A_k$ is amplitude
$f_k = k/(T*N)$ (k=0, . . . , N−1) is a frequency, where T is a sampling interval, and
$\varphi_k$ is phase.

In electric appliances, a fundamental frequency in a current waveform data is an AC power supply frequency (50 Hz/60 Hz). In the fundamental frequency, a magnitude (amplitude spectrum) may undergo a change according to a load of an electric appliance. As shown in above equation, a single waveform can be represented by sinusoidal signals of N frequency components of the sampling frequency fs (=1/T), where the sampling frequency should be at least twice the highest frequency fc contained in the signal, $f_s > 2*f_c$, in this case, $fc=f_{N-1}$. Amplitude, frequency, or phase is a variable vulnerable to anomaly. By detecting change in the variable, anomaly in the current waveform data may be identified.

The frequency spectrum is assumed to contain information of the amplitude and frequency variables. The phase of fundamental frequency may be assumed to be constant for waveform data of the M frame.

Phase alignment is performed before analyzing the frequency spectrum. The waveform data of a current signal of each frame may be sampled so as to have a constant phase relationship with regard to an AC voltage, that is, a constant phase delay against a start or zero-cross of the AC voltage cycle.

The odd/even separation unit 105 separates odd and even harmonics of a fundamental frequency (AC power supply frequency: 50 Hz/60 Hz) in the frequency spectrum matrix FL to create an odd frequency harmonic matrix O and an even frequency harmonic matrix E.

In the present example embodiment, the sampling frequency fs is assumed to be a multiple of the AC power supply frequency $f_0$ ($f_s = h*f_0$: h is a positive integer), though not limited thereto. For example, if the sampling frequency $f_s$ is 1 KHz and the AC power supply frequency $f_0$ is 50 Hz, the sampling frequency $f_s$ is 20 times the AC power supply frequency $f_0$. Assuming $h=f_s/f_0$ and that frequency components are arranged so that 1st bin (Bin 0) is a DC component, odd frequency harmonics in the frequency spectrum in each row in the M*N matrix FL, are present at frequency bins (columns): $\{2*(j-1)+1\}*h+1$ (j=1, 2, . . . ), and even frequency harmonics in the frequency spectrum in each row in the matrix FL, are present at frequency bins (columns): $2*j*h+1$ (j=1, 2, . . . ), where the maximum harmonic frequency is less or equal to than Nyquist frequency fs/2.

When an element of the i-th row and j-th column in the matrix FL, the odd frequency harmonic matrix O, and the even frequency harmonic matrix O is represented by FL(i,j), O(i,j), and E(i,j), then $$O(i,j)=FL(i,\{2*(j-1)+1\}*h+1),$$

$$E(i,j)=FL(i,2*j*h+1)$$

$(i=1, \ldots ,M, j=1, \ldots ,j$ max, where $(2*j_{max}*h+1)$
 $*f_0 <= f_s/2$) (11)

The canonical correlation analysis unit 106 performs canonical correlation analysis (CCA) between the odd frequency harmonic matrix O and the even frequency harmonic matrix E. CCA finds projective directions which maximize correlation between feature vectors of two feature sets.

Given a data set with n pairs of feature vectors $\{(a_i, b_i)$ i=1, . . . , n\}, where $a_i$ and $b_i$ are p-dimensional and q-dimensional vectors, $$A=[a_1-\bar{a}, \ldots ,a_n-\bar{a}] \in R^{p \times n}$$

where $$\bar{a} = \frac{1}{n}\sum_{i=1}^{n} a_i \quad (12)$$

$$B = [b_1-\bar{b}, \ldots , b_n-\bar{b}] \in R^{q \times n}$$

where $$\bar{b} = \frac{1}{n}\sum_{i=1}^{n} b_i$$

CCA is expressed as $$\text{argmax}_{g_a,g_b} g_a^T AB^T g_b$$

$$g_a^T AA^T g_a = 1, g_b^T BB^T g_b = 1 \quad (13)$$

where argmax $g_a$, $g_b$ gives projective directions $g_a$ and $g_b$ at which the function value of $g_a^T AB^T g_b$ is maximized and a superscript T is a transpose operator.

After finding a pair of projective directions ($g_{a1}$, $g_{b1}$), satisfying the above conditions, the second pair of projective directions can be found by solving the optimization problem such as:

$$\text{argmax}_{g_a,g_b} g_a^T AB^T g_b$$

$$g_a^T AA^T g_a = 1, g_b^T BB^T g_b = 1$$

$$g_{a1}^T AA^T g_a = 0, g_{b1}^T BB^T g_b = 0 \quad (14)$$

Repeating the above process is solving the paired eigen value problems $$\text{argmax}_{g_a,g_b} g_a^T AB^T g_b$$

$$AB^T(BB^T)^{-1}BA^T g_a = \lambda AA^T g_a,$$

$$BA^T(AA^T)^{-1}AB^T g_b = \lambda BB^T g_b \quad (15)$$

Eigenvectors ($g_{ai}$, $g_{bi}$) (i=1, . . . , 1), i.e., corresponding to the 1 largest eigenvalues are the pairs of the projective directions for CCA.

$$\{(g_{ai})^T A, i = 1, \ldots , l\} \quad (16)$$
$$\{(g_{bi})^T B, i = 1, \ldots , l\}$$

compose feature sets extracted from the matrices A and B by CCA.

The canonical correlation analysis unit 106 calculate the above process by using O and E matrices as the matrices A and B to obtain the projective directions which maximize correlation between feature vectors of two feature sets of the matrices O and E.

$$\{(g_{oi})^T O, i = 1, \ldots , l\} \quad (17)$$
$$\{(g_{ei})^T E, i = 1, \ldots , l\}$$

This result in the dimension reduction of the matrices O and E.

In the present example embodiment, CCA which finds projective directions to maximize correlation between feature vectors of two feature sets of the matrices O and E, is preferably used. But, the present example embodiment is not limited to CCA. For example, PCA (Principal Component Analysis) may be used.

Let's assume Y is m*p matrix. The covariance matrix is calculated.

$$C = \frac{1}{m-1} YY^T \quad (18)$$

PCA performs eigenvalue decomposition of the covariance matrix C to find eigen vectors and eigen values of the covariance matrix C:

$$C = U\Sigma U^T \quad (19)$$

where U is an orthogonal matrix $$UU^T = U^T U = I$$

and Σ is a diagonal matrix having eigen values λ of the covariance matrix in m diagonal elements in descending orders and has values 0 in other elements.

$$\Sigma = \text{diag}(\lambda_1, \lambda_2, \ldots, \lambda_m), \lambda_1 \geq \lambda_2 \geq \ldots \geq X_m \quad (20)$$

Selecting the first l-th PCA components corresponding to the l largest eigen values among m eigen values results in dimension reduction. When using PCA, the matrix Y in the equation (18), may be set to the matrix O and the matrix E. SVD (Singular Value Decomposition) may also be used.

The linear transformation unit 107 performs linear transformation such as mean, PCA or the like on features vectors extracted by the canonical correlation analysis to obtain transformed features. More specifically, the linear transformation is performed on CCA features, i.e., matrix O and matrix E. For example, the 1st column of the matrix O and 1st column of the matrix E may be concatenated to create a new matrix of size (M,2) (M rows and 2 columns), where M is the number of frames. The linear transformation like PCA is applied on the new matrix of size (M, 2) to get a transformed matrix of size (M, 1) (i.e., a column vector of M rows). In place of PCA, any linear transformation like mean can be used and applied to convert a matrix of size (M,2) to (M,1). Likewise, each columns of the matrix O and the matrix E may be combined, and linear transformation may be applied thereto. The linear transformation unit 107 keeps space of CCA transformed features as it is. By applying linear transformation on CCA features, the transformed feature can be transformed back to CCA original space.

PCA which functions mapping from a high dimensional space to a low dimension space may be used for dimension reduction of features vectors of odd and even matrices.

The model generation unit 108 generates a model such as cluster model based on the transformed features output by the linear transformation unit 107. The model generation unit 108 may as a matter of course generates a supervised learned model if labels are available. The model generation unit 108 may as a matter of course generates a semi-supervised learned model if normal labels are available.

In case of PCA used as the linear transformation, when the first three principal components are selected, a feature space of the model would become three-dimensional space.

Figure 4:
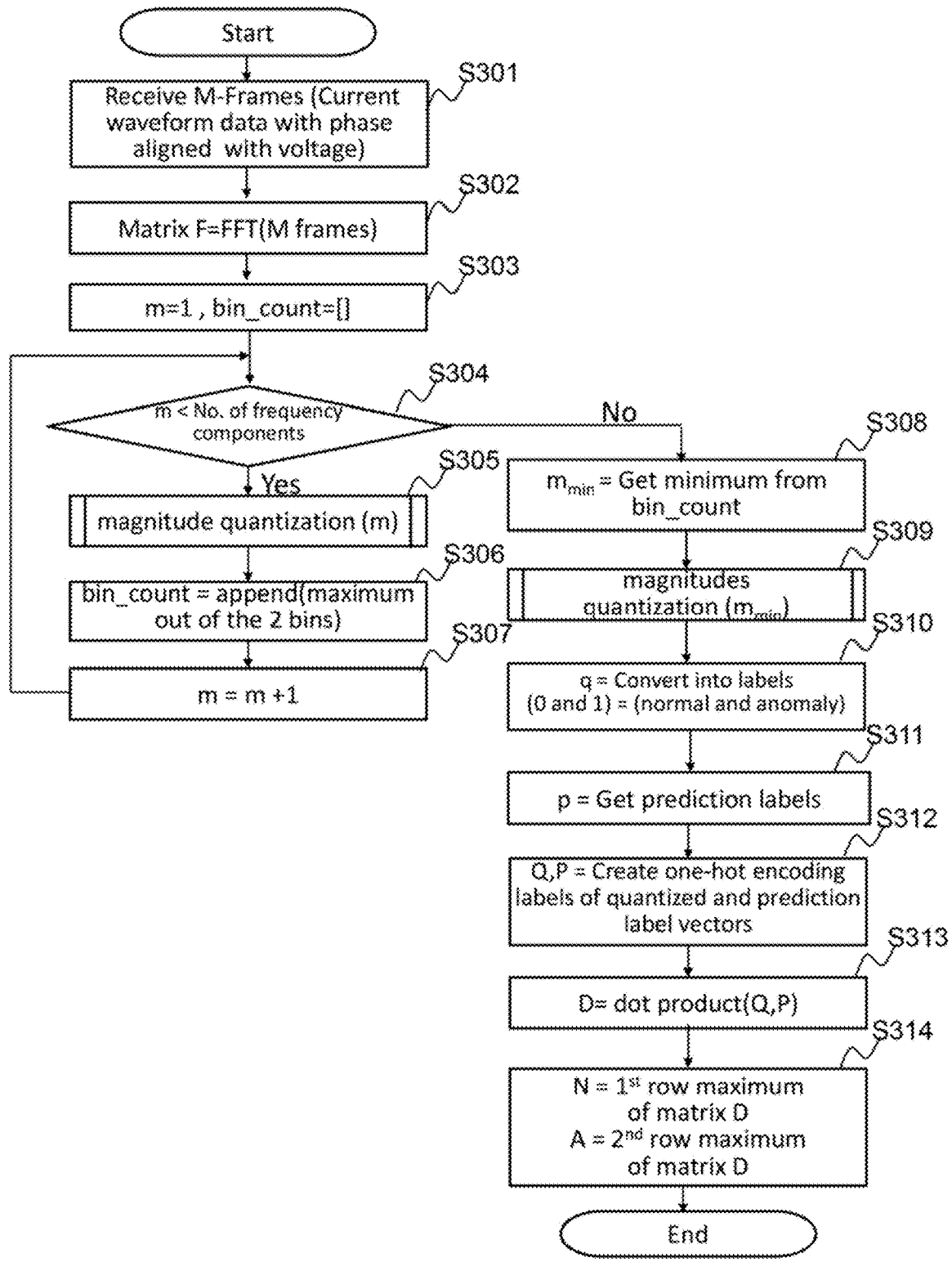
FIG. 4 is a flow chart illustrating an operation of the first example embodiment.

The identification unit 109 receives the frequency spectrum matrix F (defined in the expression (6)), or the matrix FN (defined in the expression (7)) which has been obtained by applying FFT to M sets of waveform data (M frames), and normalization processing. The identification unit 109 performs iterative magnitude quantization to identify normal and anomaly waveform signals. FIG. 4 is a flow chart illustrating an operation of the identification unit 109. In FIG. 4, a step S301 corresponds to the step S201 in FIG. 2 and a step S302 corresponds to the step S202, or S202-S204. The frequency spectrum processing unit 104 may be configured to store the calculated frequency spectrum matrix F, or FN in the storage 102 and the identification unit 109 may be configured to receive (read) the frequency spectrum matrix F, or FN from the storage 102. Here, the frequency spectrum matrix F or FN is denoted as matrix F.

A loop variable m of for-loop is initialized to 1 and a list bin_count is initialized to null (Step S303).

The body of the for-loop (S304-S307) is executed. That is, from m=1 to the number of the frequency components (the number of the harmonics of the AC power supply frequency) in the frequency spectrum matrix F, steps S305 to S307 (body of the for-loop) are repeated.

<Step S305> Call a subroutine: magnitude_quantization (also termed as RMS_quantization) with an argument set to m.

<Step S306> Append to, the bin_count, the maximum count value (or the larger count value) out of 2 bins returned by the subroutine Magnitude quantization (m).

<Step S307> Increment m by 1.

The identification unit 109 appends to the bin_count, the maximum count, in each of iterations (m=1 to the maximum number of the frequency components (the number of the harmonics in the frequency spectrum)). The bin_count is a linear list made up of maximum counts obtained at respective frequency components, wherein a length of the list is the number of the frequency components (i.e., the number of frequency harmonics less than the Nyquist frequency). In this example, the bin_count is composed of a list of maximum count values arranged in an ascending order of the frequency components, though not limited thereto.

Figure 5:
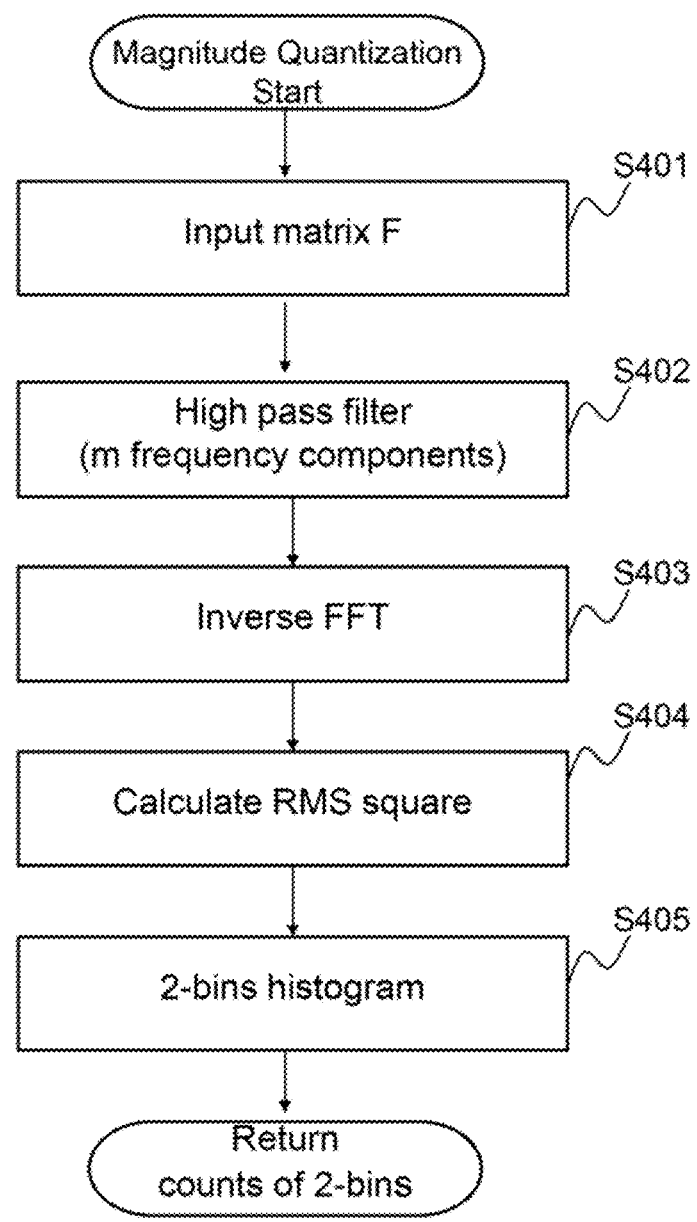
FIG. 5 is a diagram illustrating an arrangement of RMS quantization in FIG. 4.

FIG. 5 is a flow chart illustrating an operation of the magnitude (RMS) quantization (subroutine) in FIG. 4.

<Step S401> Input the frequency spectrum matrix F (each of M rows has amplitude spectrum of a frame). A copy of the input frequency spectrum matrix F may be stored as a matrix F' in a memory, write/read access to which can be locally done by the magnitude (RMS) quantization (subroutine) in order to prevent contents of the original frequency spectrum matrix F from being changed by the magnitude (RMS) quantization (subroutine).

<Step S402> Apply high pass filtering to each of M rows of the frequency spectrum matrix F' to extract m frequency components (m-th and higher frequency components). The value m is handed over to the subroutine: magnitude quantization, as an input argument (frequency component number): m. In place of high pass filtering, band pass filtering may be applied to each row of the frequency spectrum matrix F'.

<Step S403> Apply Inverse FFT to each of M rows of the high pass filtered frequency spectrum matrix F' to obtain M sets of time domain waveform data, each time domain waveform data corresponding to each row of the frequency spectrum matrix F' subjected to the high pass filtering.

<Step S404> Calculate RMS square for M sets of the time domain waveform data obtained by applying the Inverse FFT to the high pass filtered frequency spectrum matrix F'.

<Step S405> Create 2-bins histogram.

An RMS vector of M-dimension having M RMS values calculated for M sets of the time domain waveform data is created. Then, a histogram is calculated on this RMS vector, with 2 number of bins. That is, in the 2-bins histogram, a horizontal axis is an RMS value, in which the RMS value is segmented into 2 bins consisting of a lower_range and an upper range, and a vertical axis is a histogram count (count in each bin). A value in the RMS vector is categorized into either one out of 2-bins and the count in the corresponding bin is incremented. The magnitude (RMS) quantization may return a bin_range in addition to the count values (histogram count) of each bin.

Referring back to FIG. 4, in the step S304, if m is more than the number of the frequency component, exit from the for-loop and jump to Step S308 is executed. The identification unit 109 executes the following.

<Step S308> Obtain a frequency component $m_{min}$ at which the bin_count takes the minimum value.

<Step S309> Call a subroutine: magnitude_quantization with an argument set to $m_{min}$.

<Step S310> Convert the values obtained by the magnitude_quantization ($m_{min}$) into labels: q.

From a bin_range, which an RMS value in a RMS vector falls in which bin_range is calculated. Next, tagging of lower bin_range as 0 and higher bin_range as 1 are performed. This is based on supposition that the low bin_range values are normal and higher bin_range values are anomaly instances. Step S310 tags labels as 0 and 1 to each instance. 0 is normal and 1 is anomaly. These tags or labels are named as RMS quantized labels.

<Step S311> Prediction labels is obtained and set to p. This step gets for each instance, model prediction labels. For example, if clustering is applied, each instance belongs to one of the clusters. In case of 2 clusters, each instance will be predicted as either cluster number 0 or cluster number 1. These cluster number are named as prediction labels.

<Step S312> One-hot encoding labels of quantized and predicted label vectors are set to P and Q.

One hot encoding is a process by which categorical variables are converted into a form that could be provided to Machine Learning algorithms for prediction. In case of two clusters, Q and P have M rows and 2 columns, where M is number of samples.

Let's assume one_hot labels of quantized and predicted label vectors: q=[1 1 0 0 1], and p=[1 1 0 0 1], where M=5, then $$Q = \begin{bmatrix} 0 & 1 \\ 0 & 1 \\ 1 & 0 \\ 1 & 0 \\ 0 & 1 \end{bmatrix}$$

$$P = \begin{bmatrix} 0 & 1 \\ 0 & 1 \\ 1 & 0 \\ 1 & 0 \\ 0 & 1 \end{bmatrix}$$

<Step S313> Matrix D=dot product (Q, P)

Q and P are matrices of size (N,2), where N is number of samples and 2 is number of columns (that are 0 and 1 labels). Taking dot product of the matrices Q and P is to calculate a covariance between the matrices Q and P. The matrix D, the result of dot product: dot ($Q^T$,P) is a 2*2 matrix, where rows are quantized labels and columns are predicted labels.

<Step S314> Normal=1st row maximum of the matrix D, Anomaly=2nd row maximum of the matrix D.

In the present example embodiment, identifying which predicted cluster is normal or anomaly is based on an assumption that quantized labels with 0 is normal and quantized labels with 1 is anomaly.

In each row of the matrix D, the value with maximum will identify which predicted label (in columns) is normal or anomaly.

Let's the matrix D:

$$D = \begin{pmatrix} 10 & 90 \\ 80 & 20 \end{pmatrix}$$

Quantized labels with 0 are assumed as normal, and to find a name (normal or anomaly) for prediction labels, maximum in 1st and 2nd rows of the matrix D are selected as the name. For example, as illustrated in FIG. 6, where the matrix D is illustrated with a gray scale, in the 1st row of the matrix D, the maximum is 90, which means that predicted label 1 is a normal cluster. In the 2nd row of the matrix D, the maximum is 80, which means that predicted label 0 is an anomaly cluster. This is how it is made possible to identify clusters as normal or anomaly (which cluster is normal and which is anomalous), based on quantized labels.

Figure 7:
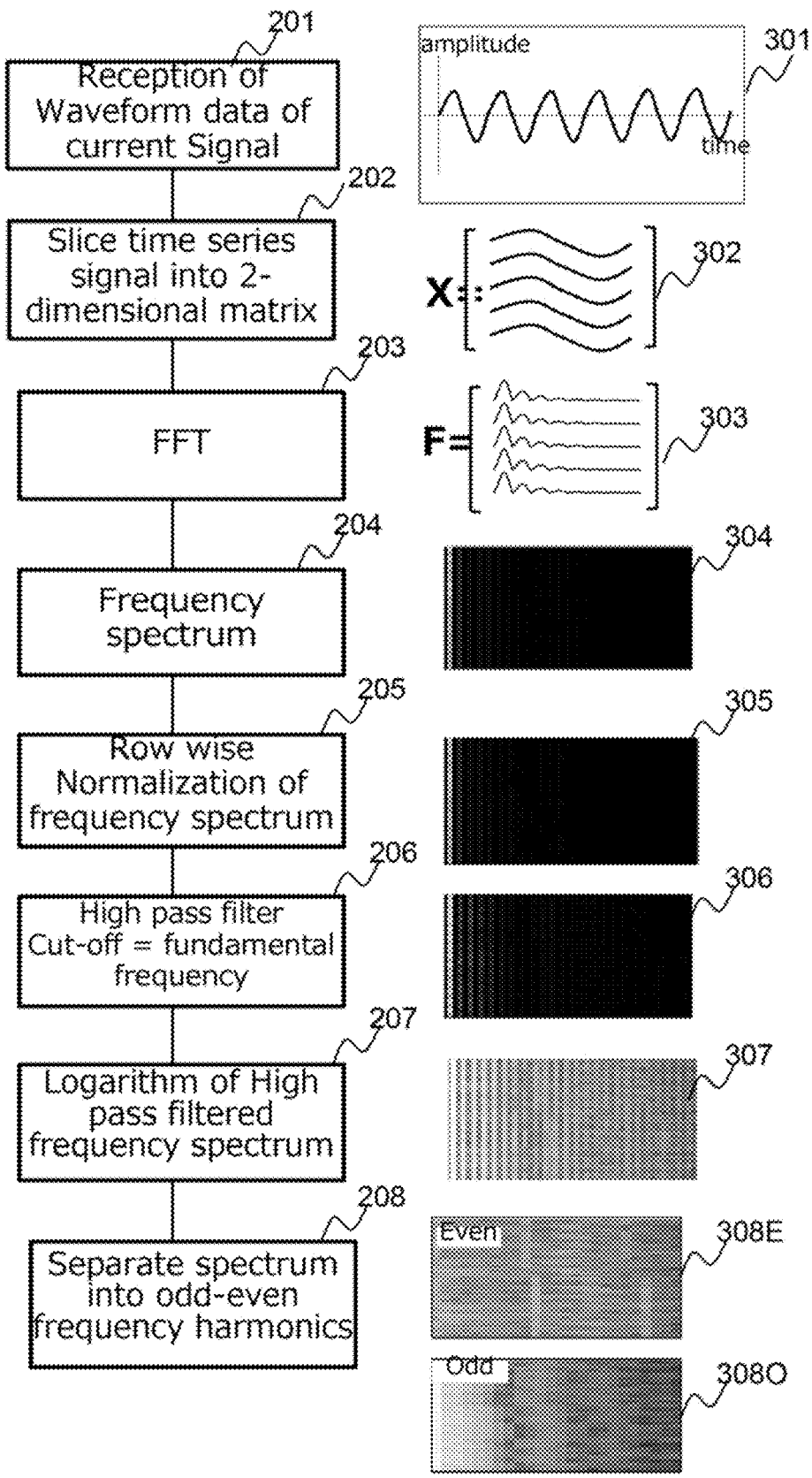
FIG. 7 is a diagram for explaining the first example embodiment.
Figure 8:
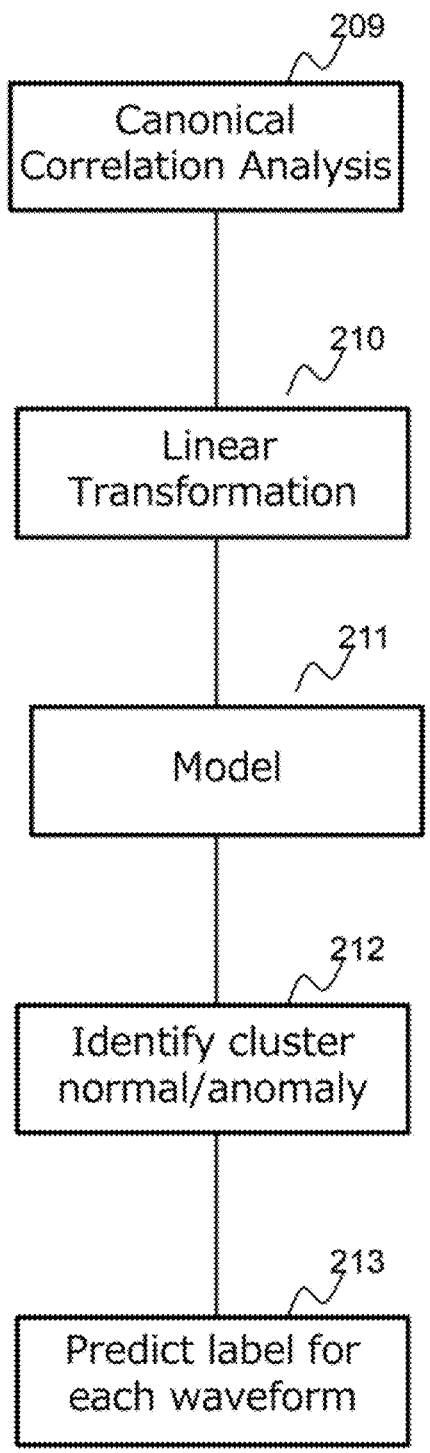
FIG. 8 is a diagram for explaining the first example embodiment.
Figure 8:
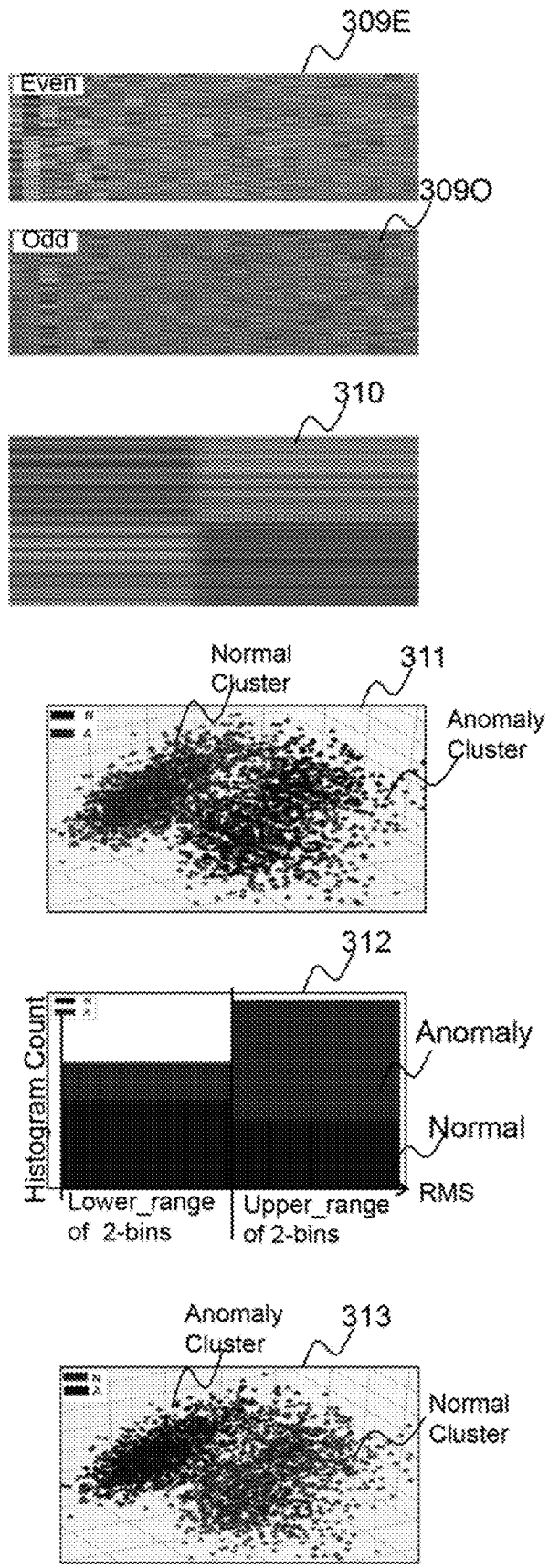

FIGS. 7 and 8 are diagrams schematically illustrating an example of a sequence of the present example embodiment, with some experimental results (image data) output by the output unit 103 in FIG. 2.

Time series waveform signal (201) is a sample waveform data of a consumption current of an electric appliance. Image 301 illustrates an example of the waveform. By slicing time series signal into M sets of waveform data (each having N samples) and arranging each of M sets of waveform data in a row in the order of time, in two-dimensional matrix X (202). Plural sets of sliced waveform data (302) of the current signal are each phase aligned to a start of a cycle (zero-cross) of an AC voltage signal fed to the electric appliance.

Plural sets of sliced waveform data is transformed to a frequency domain by FFT or DFT (if N is a power of 2, FFT may be performed) (203) and a M*N frequency spectrum matrix F (303). The frequency spectrum obtained by FFT (204) is shown as an image data 304, where the magnitude (intensity) of at each frequency bin in the frequency spectrum of M sets of wave from data, is output (displayed) in proportion to luminance, i.e., brightness.

An image 305 is a result (image data displayed on a display device) of the row-wise normalization of frequency spectrum (205). An image data 306 is a result of the high pass filtering (206).

An image data 307 is a result of the logarithm of the frequency spectrum matrix after high pass filtering (207).

Image data 308E and 308O are results of the separation of odd and even frequency harmonics (308).

Image data 309E and 309O are results of the CCA (209).

An image data 310 is a result of the first two dimension of linear transformation (210).

An image data 311 is a clustering result using a model (cluster model) (211). In the image data 311, 2-class clustering is displayed in the 3-dimesional axes. That is, 2-class (normal and abnormal) clustering is executed on the 3-dimesional feature space, wherein the dimension of feature space is reduced to 3 by the linear transformation unit 107.

An image data 312 illustrates 2-bins histogram for each of normal and anomaly waveform signals, output by the identification unit 109 which identifies normal/anomaly (212). In the image data 312, a horizontal axis is an RMS(root mean square) value and a vertical axis is a count in each bin (histogram count), where an anomaly section has a larger count in a range of greater values of RMS than in a range of smaller values of RMS, while a normal section has a larger count in a range of smaller values of RMS than in a range of larger values of RMS.

An image data 313 is an output of the prediction result of waveform data by the identification unit 109 (213). As shown in the image 313, anomaly cluster and normal cluster based on predicted labels are interchanged from clustering model in the clustering result in the image 311.

Figure 9:
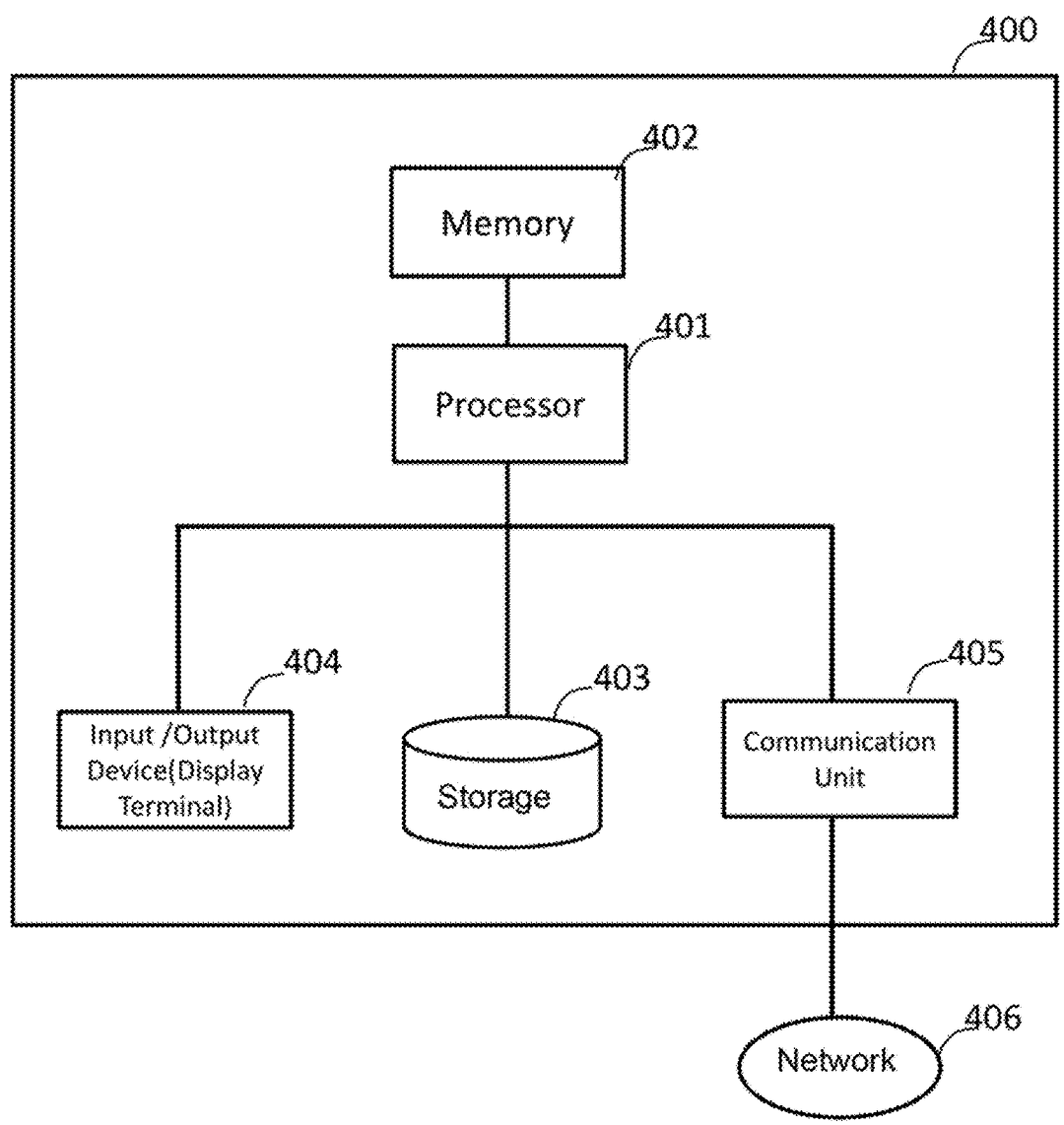
FIG. 9 is a diagram illustrating an arrangement of a second example embodiment.

The anomaly detection apparatus 100 (or system) described in the above example embodiments may be implemented on a computer system such as a server system (or a cloud system), as illustrated in FIG. 9, for example. Referring to FIG. 9, a computer system 400, such as a server system, includes a processor (Central Processing Unit) 401, a memory 402 that may include, for example, a semiconductor memory (for example, Random Access Memory (RAM), Read Only Memory (ROM), Electrically Erasable and Programmable ROM (EEPROM), and/or a storage device including at least one of Hard Disk Drive (HDD), Compact Disc (CD), Digital Versatile Disc (DVD) and so forth, an input/output device (display terminal) 404, and a storage apparatus 404, a communication unit 405.

The computer system 400 can connect to a network 406 such as LAN (Local Area Network) and/or WAN (Wide Area Network) via the communication unit 405 that may include one or more network interface controllers (cards) (NICs). A program (instructions and data) for executing processing of the anomaly detection apparatus 100 in FIG. 2 is stored in the storage apparatus 403 and the processor 401 reads the program into a main memory provided in the memory 402, from the storage 403 to execute the program to realize the anomaly detection function according to the example embodiments.

Controlled experiment was performed to measure normal and anomaly electric current waveform (also termed as electric current signature (ECS)) of a commercial coffee machine.

For verification purpose, time is noted when the coffee machine was in normal condition. An amount of coffee beans was reduced to 60% in order to change taste of produced coffee. Though not limited thereto, anomaly is defined as change in operation of a motor of the coffee machine from normal condition, since grinding process by the motor, power-consumption will change to change ECS. 16 coffee making sequences each of normal and anomaly condition are measured and motor grinding sub-sequences is extracted.

Figure 10A:
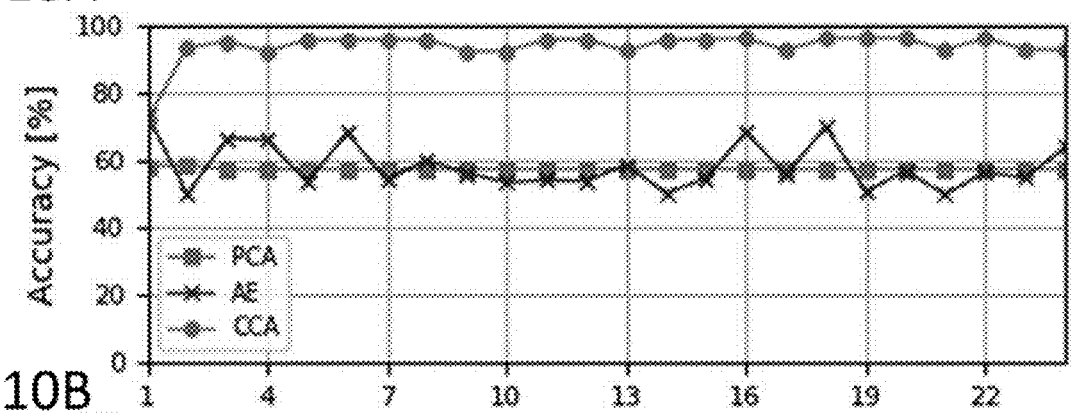
FIGS. 10A and 10B show experimental results (Accuracy and NMI).
Figure 10B:
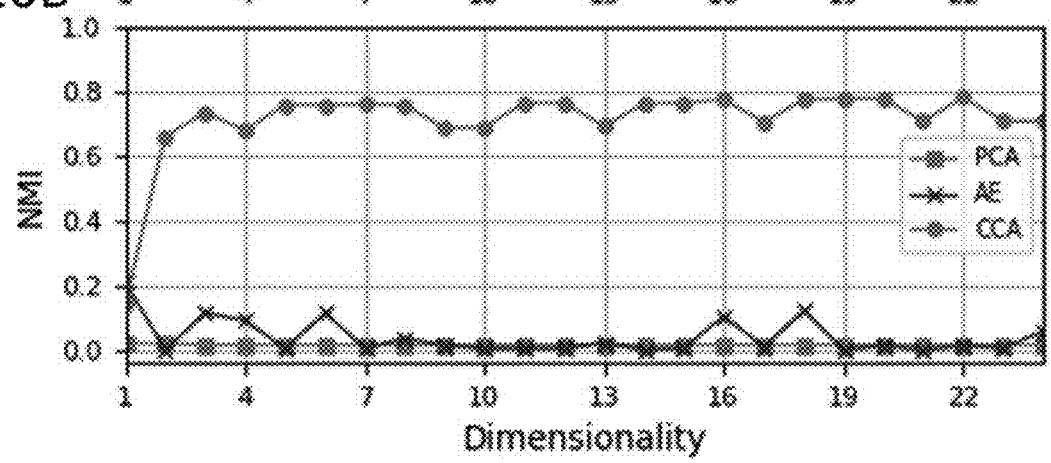

Approach:

Three methods are compared; Principal Component Analysis (PCA), Autoencoder (AE) and CCA, where CCA in FIGS. 10A and 10B represent the method of the present example embodiment described above.

The input to Principal Component Analysis (PCA) and Auto Encoder (AE) method are pre-processed frequency feature values which are kept similar with CCA input for result comparison.

In order to avoid the problem of random starting-points in k-means, clustering with the same selected features are performed for 10 times, and average results are recoded for only 2 number of clusters.

The training phase selects 10 cups each of normal and anomaly condition, while in test phase, remaining 6 cups each are selected, which is not shown in training phase.

Results:

Two metrics including clustering accuracy and normalized mutual information (NMI) are employed to measure the performance. Both of the metrics indicate better performance with a larger value. Normalized Mutual Information (NMI) is a normalization of the Mutual Information (MI) score to scale the results between 0 (no mutual information) and 1 (perfect correlation). That is, NMI value ranges from 0.0 to 1.0, with higher value means better clustering performance. Accuracy which is obtained by measuring a fraction of its clustering result that are correct, ranges from 0(=0%) to 1 (=100%), with higher value indicating better clustering performance. FIG. 10 shows experimental results, where FIGS. 10A and 10B show clustering accuracy (Accuracy) and normalized mutual information (NMI), where horizontal axis indicates dimensionality.

The performance depicted in FIGS. 10A and 10B is calculated on test data. The NMI shows high value of CCA, which means both clusters are homogeneous, complete and less over-lap in feature space as compared to other methods.

The disclosure of the aforementioned PTL 1 is incorporated by reference herein. The particular example embodiments or examples may be modified or adjusted within the scope of the entire disclosure of the present invention, inclusive of claims, based on the fundamental technical concept of the invention. In addition, a variety of combinations or selections of elements disclosed herein may be used within the concept of the claims. That is, the present invention may encompass a wide variety of modifications or corrections that may occur to those skilled in the art in accordance with the entire disclosure of the present invention, inclusive of claims and the technical concept of the present invention.

What is claimed is:

1. An anomaly detection apparatus comprising:
a processor; and
a memory in circuit communication with the processor, wherein the processor is configured to execute program instructions stored in the memory to:
obtain a plurality of sets of waveform data of a periodic electric waveform signal of an electric appliance, with a length of each of the plurality of sets of waveform data being set to one cycle time of the periodic electric waveform signal;
transform, using FFT (fast Fourier transform) processing, each of the plurality of sets of waveform data from a time domain into a frequency domain representation including a plurality of frequency bins of a fundamental frequency which is a reciprocal of the one cycle time and harmonics of the fundamental frequency;
apply a frequency processing including normalization and filtering to the frequency domain representation of each of the plurality of sets of waveform data to obtain a frequency spectrum for each of the plurality sets of waveform data;
extract and separate odd and even frequency harmonics of the fundamental frequency from the frequency spectrum of each of the plurality of sets of waveform data to create odd and even frequency harmonic matrices;
perform canonical correlation analysis (CCA) on the odd and even frequency harmonic matrices to obtain CCA features;
perform linear transformation on the CCA features to obtain linear transformed features;
generate a cluster model based on the linear transformed features;
perform magnitude quantization of the frequency spectrum of each of the plurality of sets of waveform data to identify normal and anomalous waveform signals; and
output at least the identified result, wherein the magnitude quantization includes:
applying filtering to the frequency spectrum of each of the plurality of sets of waveform data;
transforming, using inverse FFT processing, the frequency spectrum of each of the plurality of sets of waveform data into a time domain representation;
creating a two bins histogram based on an effective magnitude of each of the plurality of sets of waveform data;
creating a list or a vector, composed of a larger histogram count value out of the two-bins; and
identifying the normal and anomalous waveform signals.

2. The anomaly detection apparatus according to claim 1, wherein the periodic electric waveform signal is an AC (Alternating Current) current signal, and the plurality of sets of waveform data of the AC current signal are each phase aligned with an AC voltage signal.

3. The anomaly detection apparatus according to claim 1, wherein the processor is configured to execute the program instructions stored in the memory to model the CCA features by using:
only odd frequency harmonics,
only even frequency harmonics, or
any combination of the odd frequency harmonics and the even frequency harmonics.

4. The anomaly detection apparatus according to claim 1, wherein the processor is configured to execute the program instructions stored in the memory to calculate an amplitude spectrum for each of the plurality of frequency bins of each of the plurality of sets of waveform data, as the frequency spectrum thereof.

5. The anomaly detection apparatus according to claim 1, wherein the processor is configured to execute the program instructions stored in the memory to apply high pass filtering to the frequency spectrum of each of the plurality of sets of waveform data as has been normalized to cut off a frequency component not more than the fundamental frequency.

6. The anomaly detection apparatus according to claim 1, wherein the processor is configured to execute the program instructions stored in the memory to perform the linear transformation that generates a linear combination of the odd and even frequency harmonic matrices.

7. The anomaly detection apparatus according to claim 1, wherein the processor is configured to execute the program instructions stored in the memory to perform as the magnitude quantization, iteratively, for a number of frequency components in the frequency spectrum of each of the plurality sets of waveform data, RMS (root mean square) quantization to create the two-bins histogram based on an RMS value.

8. The anomaly detection apparatus according to claim 1, wherein the processor is configured to execute the program instructions stored in the memory to:
obtain a frequency spectrum matrix with a number of rows equal to a number of the waveform data sets and a number of columns equal to a number of frequency bins of the frequency spectrum of each of the plurality of sets of waveform data;
perform, iteratively, for a number of frequency components in the frequency spectrum in the frequency spectrum matrix, the magnitude quantization on the frequency component of each of the plurality of sets of waveform data to create the two-bins histogram;
append a larger count value out of the two-bins histogram to the list;
perform the magnitude quantization by calculating an RMS (Root Mean Square) value of time domain waveform data obtained from the frequency spectrum of the frequency spectrum matrix subjected to filtering to extract frequency components specified;
obtain a minimum frequency component where the list takes a minimum count value;
perform the magnitude quantization on the minimum frequency component;
calculate a quantized label vector by calculating a bin range in which the magnitude falls and assigning 0 to a lower range and 1 to an upper range;
calculate a predicted label vector;
generate first and second matrices using one hot-encoding of the quantized and predicted label vectors;
calculate a dot product of the first and second matrices to generate a matrix with two rows and two columns;
identify a predicted label corresponding to a maximum in the first row of the matrix with the two rows and the two columns, as normal; and
identify a predicted label corresponding a maximum in the second row of the matrix, as anomalous.

9. A computer-implemented anomaly detection method comprising:
obtaining a plurality of sets of waveform data of a periodic electric waveform signal of an electric appliance, with a length of each of the plurality of sets of waveform data being set to one cycle time of the periodic electric waveform signal;
transforming, using FFT (fast Fourier transform) processing, each of the plurality of sets of waveform data from a time domain into a frequency domain representation including a plurality of frequency bins of a fundamental frequency which is a reciprocal of the one cycle time and harmonics of the fundamental frequency;
applying a frequency processing including normalization and filtering to the frequency domain representation of each of the plurality of sets of waveform data to obtain a frequency spectrum for each of the plurality sets of waveform data;
extracting and separating odd and even frequency harmonics of the fundamental frequency from the frequency spectrum of each of the plurality of sets of waveform data to create odd and even frequency harmonic matrices;
performing canonical correlation analysis (CCA) on the odd and even frequency harmonic matrices to obtain CCA features;
performing linear transformation on the CCA features to obtain linear transformed features;
generating a cluster model based on the linear transformed features;
performing magnitude quantization of the frequency spectrum of each of the plurality of sets of waveform data to identify normal and anomalous waveform signals; and
outputting at least the identified result,
wherein the magnitude quantization includes:
applying filtering to the frequency spectrum of each of the plurality of sets of waveform data;
transforming, using inverse FFT processing, the frequency spectrum of each of the plurality of sets of waveform data into a time domain representation;
creating a two bins histogram based on an effective magnitude of each of the plurality of sets of waveform data;
creating a list or a vector, composed of a larger histogram count value out of the two-bins; and
identifying the normal and anomalous waveform signals.

10. The computer-implemented anomaly detection method according to claim 9, wherein the periodic electric waveform signal is an AC (Alternating Current) current signal, and the plurality of sets of waveform data of the AC current signal are each phase aligned with an AC voltage signal.

11. The computer-implemented anomaly detection method according to claim 9, further comprising modeling the CCA features by using:
only odd frequency harmonics,
only even frequency harmonics, or
any combination of the odd frequency harmonics and the even frequency harmonics.

12. The computer-implemented anomaly detection method according to claim 9, further comprising
calculating an amplitude spectrum for each of the plurality of frequency bins of each of the plurality of sets of waveform data, as the frequency spectrum thereof.

13. The computer-implemented anomaly detection method according to claim 9, further comprising
applying high pass filtering to the frequency spectrum of each of the plurality of sets of waveform data as has been normalized to cut off a frequency component not more than the fundamental frequency.

14. The computer-implemented anomaly detection method according to claim 9, further comprising, in performing the linear transformation, generating a linear combination of the odd and even frequency harmonic matrices.

15. The computer-implemented anomaly detection method according to claim 9, further comprising performing, as the magnitude quantization, iteratively, for a number of frequency components in the frequency spectrum of each of the plurality sets of waveform data, RMS (root mean square) quantization to create the two-bins histogram based on an RMS value.

16. The computer-implemented anomaly detection method according to claim 9, further comprising:
obtaining a frequency spectrum matrix with a number of rows equal to a number of the waveform data sets and a number of columns equal to a number of frequency bins of the frequency spectrum of each of the plurality of sets of waveform data;
performing, iteratively, for a number of frequency components in the frequency spectrum in the frequency spectrum matrix, the magnitude quantization on the frequency component of each of the plurality of sets of waveform data to create the two-bins histogram;
append a larger count value out of the two-bins histogram to the list;
performing the magnitude quantization by calculating an RMS (Root Mean Square) value of time domain waveform data obtained from the frequency spectrum of the frequency spectrum matrix subjected to filtering to extract frequency components specified;
obtaining a minimum frequency component where the list takes a minimum count value;
performing the magnitude quantization on the minimum frequency component;
calculating a quantized label vector by calculating a bin range in which the magnitude falls and assigning 0 to a lower range and 1 to an upper range;
calculating a predicted label vector;
generating first and second matrices using one hot-encoding of the quantized and predicted label vectors;
calculating a dot product of the first and second matrices to generate a matrix with two rows and two columns;
identifying a predicted label corresponding to a maximum in the first row of the matrix with the two rows and the two columns, as normal; and
identifying a predicted label corresponding a maximum in the second row of the matrix, as anomalous.

17. A non-transitory computer-readable recording medium storing a program causing a computer to execute processing comprising:
obtaining a plurality of sets of waveform data of a periodic electric waveform signal of an electric appliance, with a length of each of the plurality of sets of waveform data being set to one cycle time of the periodic electric waveform signal;
transforming, using FFT (fast Fourier transform) processing, each of the plurality of sets of waveform data from a time domain into a frequency domain representation including a plurality of frequency bins of a fundamental frequency which is a reciprocal of the one cycle time and harmonics of the fundamental frequency;
applying a frequency processing including normalization and filtering to the frequency domain representation of each of the plurality of sets of waveform data to obtain a frequency spectrum for each of the plurality sets of waveform data;
extracting and separating odd and even frequency harmonics of the fundamental frequency from the frequency spectrum of each of the plurality of sets of waveform data-sets to create odd and even frequency harmonic matrices;
performing canonical correlation analysis (CCA) on the odd and even frequency harmonic matrices to obtain CCA features;
performing linear transformation on the CCA features to obtain linear transformed features;
generating a cluster model based on the linear transformed features;
performing magnitude quantization of the frequency spectrum of each of the plurality of sets of waveform data to identify normal and anomalous waveform signals; and
outputting at least the identified result,
wherein the magnitude quantization includes:
applying filtering to the frequency spectrum of each of the plurality of sets of waveform data;
transforming, using inverse FFT processing, the frequency spectrum of each of the plurality of sets of waveform data into a time domain representation;
creating a two bins histogram based on an effective magnitude of each of the plurality of sets of waveform data;
creating a list or a vector, composed of a larger histogram count value out of the two-bins; and
identifying the normal and anomalous waveform signals.

18. The non-transitory computer-readable recording medium according to claim 17, wherein the periodic electric waveform signal is an AC (Alternating Current) current signal, and the plurality of sets of waveform data of the AC current signal are each phase aligned with an AC voltage signal.

* * * * *